(12) United States Patent
Ono et al.

(10) Patent No.: US 7,258,739 B2
(45) Date of Patent: Aug. 21, 2007

(54) PROCESS FOR PRODUCING EPITAXIAL SILICON WAFER AND SILICON WAFER PRODUCED BY PROCESS THEREOF

(75) Inventors: Toshiaki Ono, Tokyo (JP); Masataka Hourai, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 211 days.

(21) Appl. No.: 11/051,112

(22) Filed: Feb. 4, 2005

(65) Prior Publication Data
US 2005/0176262 A1  Aug. 11, 2005

(30) Foreign Application Priority Data
Feb. 4, 2004   (JP)   ............... 2004-028402

(51) Int. Cl.
*C30B 15/20*   (2006.01)
(52) U.S. Cl. ............... 117/20; 117/13; 117/19
(58) Field of Classification Search ............ 117/13, 117/19, 20
See application file for complete search history.

(56) References Cited

U.S. PATENT DOCUMENTS

| | | | |
|---|---|---|---|
| 6,365,461 B1 * | 4/2002 | Asayama et al. | 438/268 |
| 6,569,237 B2 * | 5/2003 | Tanaka et al. | 117/19 |
| 6,709,957 B2 * | 3/2004 | Asayama et al. | 438/509 |

* cited by examiner

Primary Examiner—Felisa Hiteshew
(74) Attorney, Agent, or Firm—Reed Smith LLP

(57) ABSTRACT

Firstly, a silicon ingot in which boron and germanium were doped is sliced to prepare a silicon wafer and then the wafer is thermally processed by oxidation to form the thermal oxidation film on the surface layer portion of the wafer. Thereby, the concentration of germanium is enhanced in the vicinity of the interface with the thermal oxidation film of the wafer. Then, the thermal oxidation film is removed from the surface layer portion of the wafer. Further, an epitaxial layer consisting of a silicon single crystal in which a lower concentration of boron than the concentration of boron in the wafer was doped is grown on the shallow surface layer portion of the wafer by an epitaxial growth method. According to the present invention, the doping amount of germanium is reduced and the generation of misfit dislocations is suppressed.

7 Claims, 2 Drawing Sheets

(a)

(a)

(b)

PROCESS FOR PRODUCING EPITAXIAL SILICON WAFER AND SILICON WAFER PRODUCED BY PROCESS THEREOF

CROSS-REFERENCES TO RELATED APPLICATIONS

This application claims priority of Japanese Applications No. 2003-028402 filed Feb. 4, 2004, the entire disclosure of which is hereby incorporated by reference.

BACKGROUND OF THE INVENTION

1. Field of the Invention

The present invention relates to a process for producing an epitaxial silicon wafer by growing an epitaxial layer having a low boron concentration on a silicon wafer having a high boron concentration by an epitaxial growth method, and a silicon wafer produced by the process.

2. Prior Art

When an epitaxial layer in which boron was doped at low concentration was grown by an epitaxial growth method on the upper surface layer portion of a silicon wafer with low resistivity (0.003 Ω·cm or less) in which boron was doped at high concentration, misfit dislocations have been conventionally generated caused by the difference between the lattice constant of the silicon wafer and the lattice constant of the epitaxial layer. Since the misfit dislocations are moved on the shallow surface layer portion of the surface of the epitaxial layer during epitaxial growth, dislocations exist in an active zone at which semiconductor devices are prepared. Thus, when dislocations being crystal defects exist in the epitaxial layer, it causes malfunction of semiconductor devices and there is a fear of lowering their yield.

In order to solve the problem, there is disclosed a process for forming an epitaxial structure in which an epitaxial layer is deposited on a silicon substrate to which boron and germanium were doped (for example, refer to the patent literature 1: Japanese Patent Laid-Open Publication No. Sho 61-141700 (Claims 1 to 5, the third line to the eleventh line of an left upper column in page 3 of the specification and the 18$^{th}$ line of the right upper column to the second line of the left lower column in page 3 of the specification)). In the process for forming an epitaxial structure, when the concentration of boron doped on the silicon substrate is referred to as $C_B$ and the concentration of germanium doped on the silicon substrate is referred to as $C_{Ge}$, boron and germanium are doped on the silicon substrate so as to satisfy the relational formula of $C_B=6\,C_{Ge}$. Further, the thickness of the epitaxial layer is set as 5 μm and boron is doped by 0.02% by atom or more (resistivity: 0.015 Ω·cm or less).

In the epitaxial structure thus formed, the greater part of stress and corresponding strain which were caused by lattice incompatibility in an epitaxial wafer which was obtained by depositing an epitaxial layer to which a low concentration of boron was doped on a silicon substrate to which a high concentration of boron was doped are released by doping germanium in the crystal of the silicon substrate. Thereby, the epitaxial wafer does not substantially contain stress and strain is not generated irrespective of the thickness of the epitaxial layer. In other word, the degree of bending of the epitaxial wafer is made irrespective of the thickness of the epitaxial layer by the above-mentioned germanium.

Further, in order to solve the problem, there is also disclosed an epitaxial silicon single crystal wafer in which germanium was doped in the vicinity of the surface of a silicon wafer in which boron was doped in high concentration (for example, refer to the patent literature 2: Japanese Patent Laid-Open Publication No.2003-209059 (Claims 1 to 4 and paragraph [0010])). In the epitaxial silicon single crystal wafer, the concentration of boron in the wafer is $7\times10^{18}$ atoms/cm$^3$ or more and germanium is doped at a concentration of $1\times10^{20}$ to $5\times10^{20}$ atoms/cm$^3$ from the surface of the wafer to a depth of 20 nm or less.

Since the radius of covalent bond of boron is small in comparison with the radius of covalent bond of silicon in the epitaxial silicon single crystal wafer thus composed, the strain which is caused by boron is compensated by supplying tetra-valent germanium which has the larger radius of covalent bond than that of silicon and an atomic valency equal to silicon.

However, in the above-mentioned conventional process for forming an epitaxial structure which was shown in the patent literature 1, when a silicon single crystal is pulled up by the Czochralski method, the segregation coefficient of boron is different from the segregation coefficient of germanium; therefore it is difficult the concentration of boron $C_B$ and the concentration of germanium $C_{Ge}$ satisfy always the relational formula of $C_B=6\,C_{Ge}$ over the full length of the silicon single crystal which was pulled up.

Further, in the above-mentioned conventional process for forming an epitaxial structure which was shown in the patent literature 1, the doping amount of germanium which is required for doping boron in high concentration is extremely much in order to lower the resistivity of a silicon substrate. For example, when the concentration of boron is $3.6\times10^{19}$ atoms/cm$^3$ or (resistivity: 0.003 Ω·cm), the weight of germanium required is numerously 1.5 kg when the weight of silicon melt is 35 kg and since germanium is very precious, there is a problem that the production cost of the silicon substrate is increased.

Further, according to the study of the present inventors, when boron is doped in high concentration and germanium is doped in high concentration, there are problems that the probability of dislocating a silicon single crystal at growth of the silicon single crystal is enhanced and the yield of an ingot at production of the silicon single crystal is lowered.

Further, in the above-mentioned epitaxial silicon single crystal wafer which was shown in the patent literature 2, since its process is a single wafer processing that germanium is doped by every wafer, the production time of a wafer is elongated and there was a problem that its production cost was greatly pushed up.

It is the object of the present invention to provide a process for producing an epitaxial silicon wafer which can reduce the doping amount of germanium, can suppress the generation of misfit dislocations and can further shorten the production time of the wafer, and a silicon wafer produced by the process.

SUMMARY OF THE INVENTION

The present invention is related to a process for producing an epitaxial silicon wafer comprising a step of preparing a silicon wafer by slicing a silicon ingot to which boron and germanium were doped, a step of enhancing a concentration of germanium in the vicinity of the interface with the thermal oxidation film of the wafer by thermally processing the wafer by oxidation to form the thermal oxidation film on the surface layer portion of the wafer, a step of removing the thermal oxidation film from the surface layer portion of the wafer, and a step of growing an epitaxial layer consisting of a silicon single crystal in which a lower concentration of boron than the concentration of boron in the wafer was doped, on the shallow surface layer portion of the wafer by an epitaxial growth method.

In the process for producing an epitaxial silicon wafer, when the thermal oxidation processing of the silicon wafer which was grown by doping boron and germanium is carried out, the thermal oxidation film is formed in the surface layer portion of the wafer, and the wafer which is not thermally oxidized is thinned in accordance with thickening of the thickness of the thermal oxidation film. Hereafter, since germanium in the wafer cannot exist in the thermal oxidation film in stability, it is excluded from the thermal oxidation film, it is concentrated in the vicinity of the interface with the thermal oxidation film of the wafer, and the concentration of germanium in the vicinity of the interface with the thermal oxidation film of the wafer is enhanced. Thereby, since a lattice constant which was changed by the influence of boron which was doped in high concentration is compensated by germanium in the vicinity of the interface with the thermal oxidation film of the wafer, the strain is not generated at the surface layer portion of the wafer after the thermal oxidation film was removed, and the wafer is not deformed during growth of the epitaxial layer. As a result, even if the epitaxial layer is grown on the shallow surface layer portion of the wafer, the misfit dislocations are not generated at the epitaxial layer.

It is preferable that the concentration of boron in the silicon wafer is $3.6 \times 10^{19}$ to $11.7 \times 10^{19}$ atoms/cm$^3$.

Further, the concentration of germanium in the silicon wafer is 1 to 4-fold of the concentration of boron in the wafer.

Further, it is preferable that the vicinity of the interface with the thermal oxidation film of the silicon wafer has a thickness range of 100 nm or more from the interface toward the central portion of the wafer and the maximum concentration of germanium in the vicinity of the interface is 10-fold or more of the concentration of germanium at the central portion of the wafer.

Further, in the silicon wafer which was produced by the above-mentioned process, since the misfit dislocations are not generated at the epitaxial layer, malfunction of a semiconductor device produced by using the wafer can be prevented.

As described above, according to the present invention, since the silicon wafer is prepared by slicing a silicon ingot in which boron and germanium were doped and the wafer is thermally processed by oxidation to form the thermal oxidation film on the surface layer portion of the wafer, the wafer is thinned in accordance with thickening of the thickness of the thermal oxidation film, germanium in the wafer is excluded from the thermal oxidation film, it is concentrated in the vicinity of the interface with the thermal oxidation film of the wafer, and the concentration of germanium is enhanced. Thereby, a lattice constant which was changed by the influence of boron which was doped in high concentration is compensated by germanium in the vicinity of the interface with the thermal oxidation film of the wafer. As a result, the strain is not generated at the surface layer portion of the wafer from which the thermal oxidation film was removed and the wafer is not deformed during growth of the epitaxial layer; therefore even if the epitaxial layer is grown on the shallow surface layer portion of the wafer, the misfit dislocations are not generated at the epitaxial layer.

Further, even if the amount of germanium which is doped in the silicon ingot is comparatively little, germanium in the surface layer portion of the wafer is concentrated by the thermal oxidation processing; therefore the doping amount of precious germanium can be reduced. As a result, production cost can be reduced.

Since germanium is doped at growth of the silicon ingot in the present invention in comparison with conventional epitaxial silicon single crystal for which its process is a single wafer processing which dopes germanium by every wafer and the production time of a wafer is elongated, it is unnecessary to dope germanium by every wafer. As a result, since the production time of the wafer can be shortened in the present invention, the production cost of the wafer can be reduced.

Further, since the misfit dislocations are not generated at the epitaxial layer for the silicon wafer which was produced by the above-mentioned process, malfunction of a semiconductor device which was produced using the wafer can be reduced. As a result, the lowering of a yield can be prevented.

DETAILED DESCRIPTION OF THE PREFERRED EMBODIMENT

Figure 1:
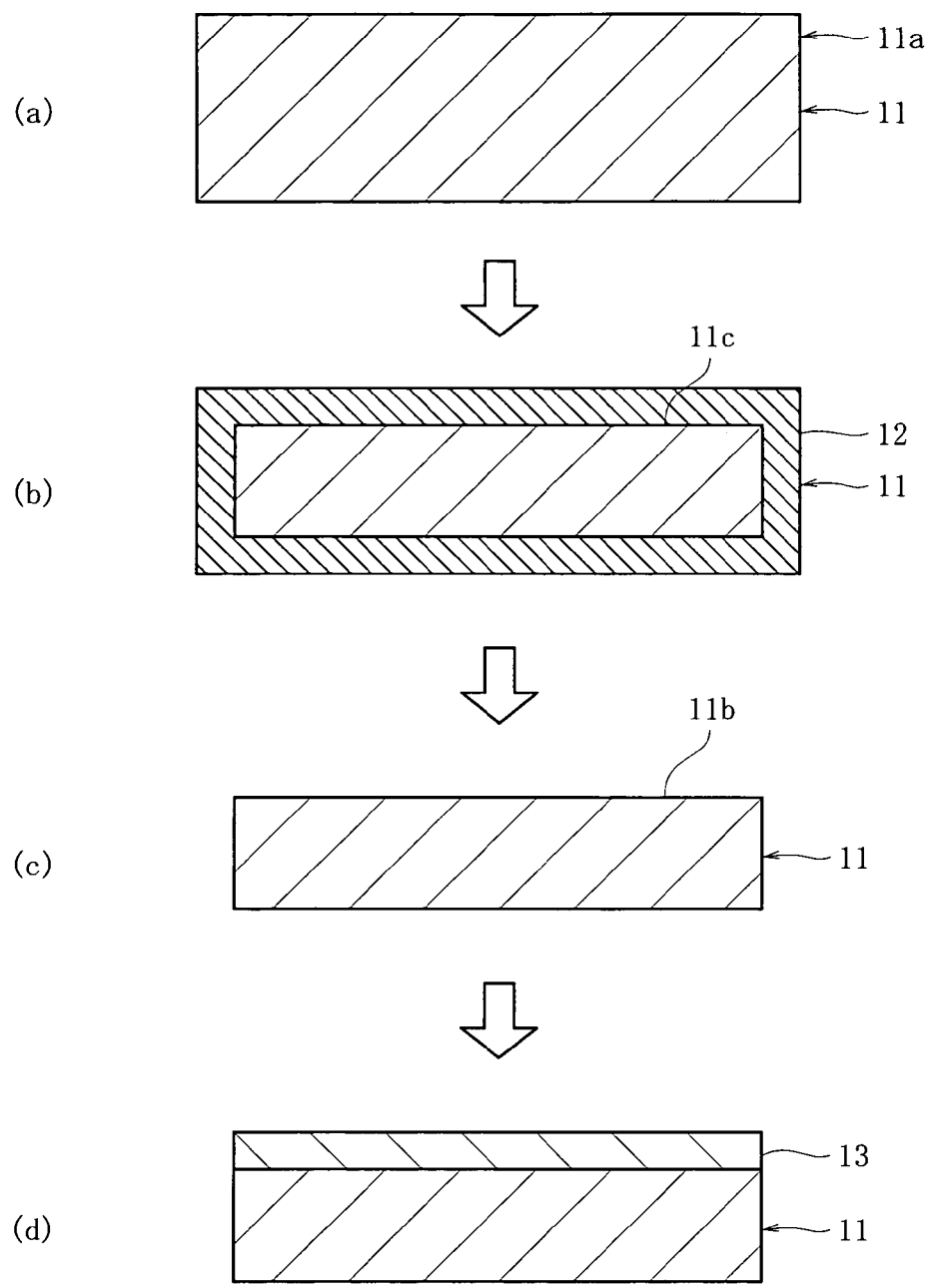
FIG. 1 is a step diagram illustrating the production procedure of the epitaxial silicon wafer of an embodiment of the present invention.

The preferred embodiment for performing the present invention is illustrated referring to the drawings.

Figure 2:
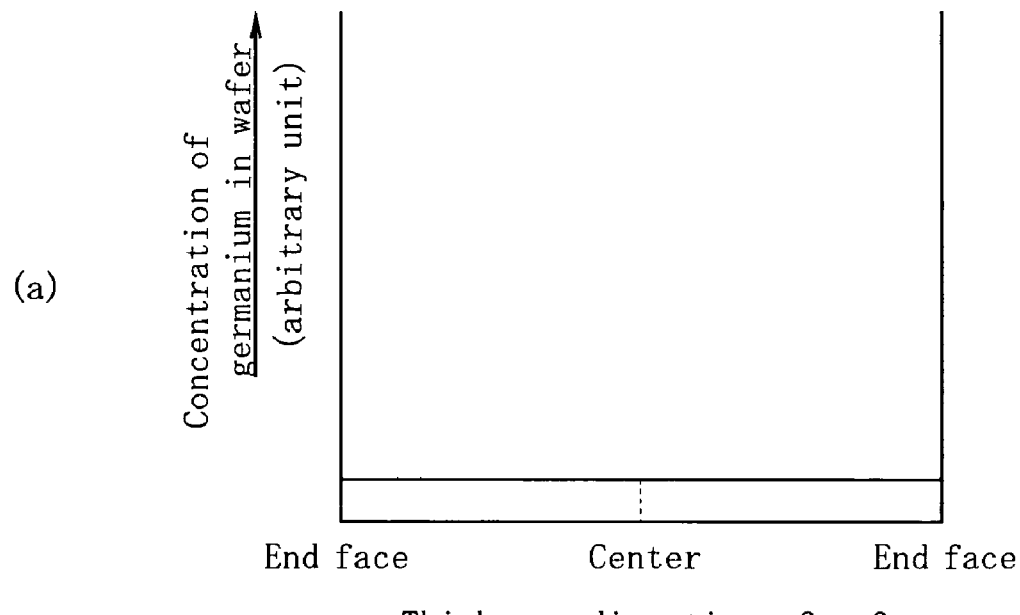
FIG. 2 is a diagram illustrating the distribution of the concentration of germanium in the wafer to a thickness direction, (a) illustrates the distribution of the concentration of germanium to a thickness direction in a wafer before the wafer is thermally processed, and (b) is a diagram illustrating the distribution of the concentration of germanium to a thickness direction in a wafer after the wafer was thermally processed.
Figure 2:
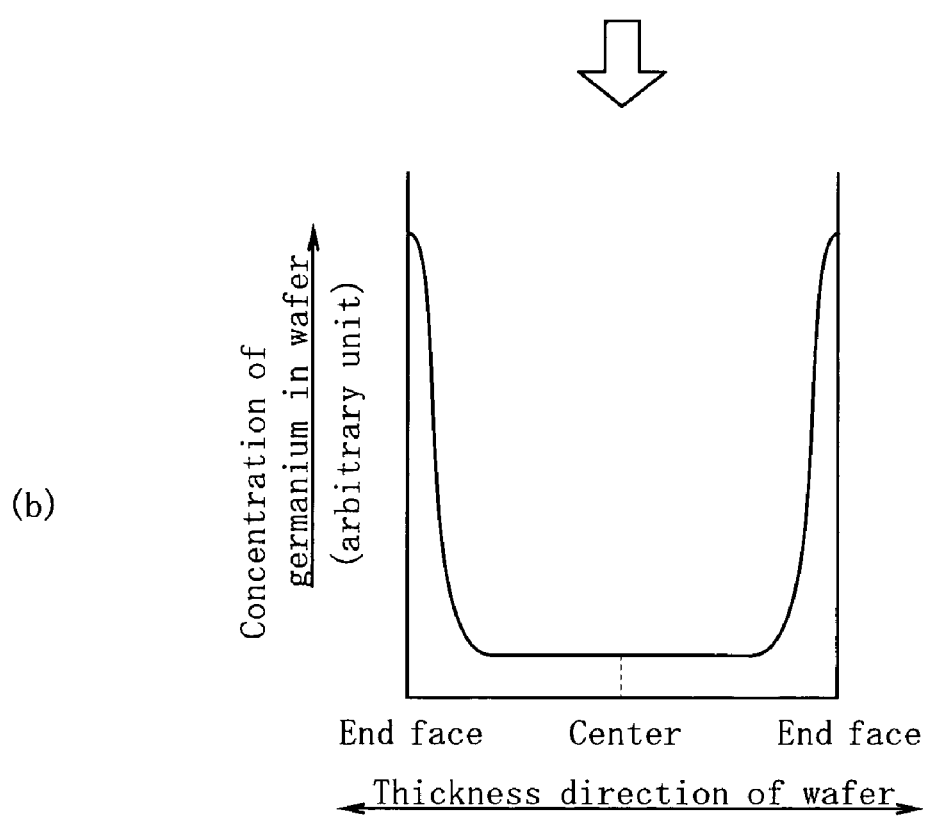

As shown in FIG. 1(a), after boron and germanium were firstly doped and an ingot was pulled up by the Czochralski method, the ingot is sliced to obtain the silicon wafer 11. The concentration of boron in the ingot is set at $3.6 \times 10^{19}$ to $11.7 \times 10^{19}$ atoms/cm$^3$ and the concentration of germanium in the ingot is set at 1 to 4-fold of the concentration of boron in the ingot. Further, the concentration of germanium in the wafer 11 is uniformly distributed to the radius direction of the wafer 11 and uniformly distributed to the thickness direction of the wafer 11 (FIG. 2(a)). Herein, the reason why the concentration of boron in the ingot was limited at $3.6 \times 10^{19}$ to $11.7 \times 10^{19}$ atoms/cm$^3$ is that an ingot having an extremely low resistivity of 0.001 to 0.003 Ω·cm is designed to be obtained. Further, the reason why the concentration of germanium in the ingot was limited at 1 to 4-fold of the concentration of boron in the ingot is that even if the thermal oxidation processing for a long time is processed for concentrating germanium at less than 1-fold, a lattice change by boron is not compensated and when it exceeds 4-fold, production cost is increased and the lattice change can be compensated only by doping germanium without the thermal oxidation processing. Further, the silicon ingot may be grown not by the Czochralski method, but by a floating zone method.

Then, the wafer 11 is thermally oxidized and the thermal oxidation film 12 is formed on the surface layer portion 11a of the wafer 11 (FIG. 1(b)). The thermal oxidation processing is carried out by retaining the wafer at a temperature of 900 to 1100° C. for 4 to 16 hours in oxidizing atmosphere under normal pressure. Herein, "in oxidizing atmosphere" means "in air" or "in oxygen atmosphere". The reason why pressure and temperature and the thermal oxidation processing time at the thermal oxidation processing were limited to the above-mentioned range is that the maximum concentration of germanium in the vicinity of the interface 11c with the thermal oxidation film 12 of the wafer 11 is designed to be 10-fold or more and preferably 10 to 20-fold of the concentration of germanium at the central portion of the wafer. The thermal oxidation film 12 of the surface layer portion 11a of the wafer 11 is gradually thickened and the wafer 11 which is not thermally oxidized is gradually thinned in accordance with this. Hereat, since germanium in the wafer 11 cannot exist in the thermal oxidation film 12 in stability, is excluded from the thermal oxidation film 12 and is concentrated in the vicinity of the interface 11c with the thermal oxidation film 12 of the wafer 11 (FIG. 2(b)). Accordingly, the concentration of germanium in the vicinity of the interface 11c with the thermal oxidation film 12 of the wafer 11 is enhanced. As a result, a lattice constant which was changed by the influence of boron which was doped in high concentration is compensated by germanium in the vicinity of the interface 11c with the thermal oxidation film 12 of the wafer 11.

The vicinity of the interface 11c with the thermal oxidation film 12 of the silicon wafer 11 has a thickness range of 100 nm or more from the interface 11c toward the central portion of the wafer 11 and preferably a range of 100 to 200 nm and the maximum concentration of germanium in the vicinity of the interface 11c is set at 10-fold or more of the concentration of germanium at the central portion of the wafer 11 and preferably 10 to 20-fold. Herein, the reason why the thickness in the vicinity of the interface 11c with the thermal oxidation film 12 of the wafer 11 is limited at a range of 100 to 200 nm is that when it is less than 100 nm, it is inadequate for matching the lattice constant of the wafer 11 and when it exceeds 200 nm, the thermal processing time becomes extremely long. Further, the reason why the maximum concentration of germanium in the vicinity of the interface 11c was limited at 10 to 20-fold of the concentration of germanium at the central portion of the wafer is that when it is less than 10-fold, the concentration of germanium is too low, the lattice constants of silicon, boron and germanium cannot be matched and even if the thermal processing time and the thermal processing temperature are changed, it cannot be concentrated to the concentration exceeding 20-fold.

Then, the thermal oxidation film 12 is removed from the surface layer portion 11a of the wafer 11 (FIG. 1(c)). The removal of the thermal oxidation film 12 is carried out by immersing the wafer 11 in fluoric acid. Further, the epitaxial layer 13 consisting of the silicon single crystal in which boron having a lower concentration than the concentration of boron in the wafer 11 was doped is grown on the shallow surface layer portion 11b of the wafer 11 by the epitaxial growth method (FIG. 1(d)).

In the silicon wafer 11 thus produced, since a lattice constant which was changed by the influence of boron which was doped in high concentration in the vicinity of the interface 11c with the thermal oxidation film 12 of the wafer 11 is compensated by germanium, the strain is not generated at the surface layer portion 11a of the wafer 11, and the wafer 11 is not deformed during growth of the epitaxial layer 13. As a result, even if the epitaxial layer 13 is grown on the shallow surface layer portion 11b of the wafer 11 from which the thermal oxidation film 12 was removed, the misfit dislocations are not generated at the epitaxial layer 13. Consequently, since malfunction of a semiconductor device which was produced using the wafer 11 can be reduced, the lowering of the yield can be prevented.

EXAMPLES

Then, Examples of the present invention are specifically illustrated together with Comparative Examples as follow.

Example 1

As shown in FIG. 1(a), firstly, after a silicon ingot in which boron was doped at $5.1 \times 10^{19}$ atoms/cm$^3$ and germanium was doped at $1.7 \times 10^{20}$ atoms/cm$^3$ was pulled up by the Czochralski method, the ingot was sliced to prepare the silicon wafer 11. Then, the thermal oxidation processing was carried out by retaining the wafer 11 at a temperature of 1100° C. for 4 hours in oxidizing atmosphere under normal pressure to form the thermal oxidation film 12 on the surface layer portion 11a of the wafer 11 (FIG. 1(b)). Then, the thermal oxidation film 12 was removed from the surface layer portion 11a of the wafer 11 by immersing the wafer 11 in fluoric acid (FIG. 1(c)). Further, the epitaxial layer 13 consisting of the silicon single crystal to which boron was doped was grown on the shallow surface layer portion 11b of the wafer 11 by the epitaxial growth method. The thickness of the epitaxial layer 13 was 10 μm. The wafer 11 was referred to as Example 1.

Example 2

A wafer was prepared in like manner as Example 1 except the thermal oxidation processing time was 16 hours. The wafer was referred to as Example 2.

Comparative Example 1

A wafer was prepared in like manner as Example 1 except the thermal oxidation processing time was one hour. The wafer was referred to as Comparative Example 1.

Comparative Example 2

A wafer was prepared in like manner as Example 1 except the thermal oxidation processing was not carried out. The wafer was referred to as Comparative Example 2.

Comparative Test and Evaluation

In the wafers of Examples 1 and 2 and Comparative Example 1, the distribution of the concentration of germanium to a thickness direction was respectively measured using a secondary ion mass analyzer (SIMS) after carrying out the thermal oxidation processing and before forming the epitaxial layer, and the thickness of the layer to which germanium was concentrated and the maximum concentration of germanium in the concentrated layer were respectively determined. These values are shown in Table 1. Further, the thickness of the concentrated layer of germanium was a range in which the concentration of germanium was $1.7 \times 10^{20}$ atoms/cm$^3$ or more.

Further, the situation of generating misfit dislocations in the epitaxial layers of the wafers of Examples 1 and 2 and Comparative Example 1 was investigated by the X-ray topography method. Specifically, the quantity of the misfit dislocations generated in the whole surface of the epitaxial layer was measured. The result is shown in Table 1. In table 1, "Ge concentration ratio" represents a ratio of "Ge maximum concentration/Ge concentration".

TABLE 1

| | Resistivity (Ω · cm) | B concentration (×10¹⁹ atoms/cm³) | Ge concentration (×10²⁰ atoms/cm³) | Ge concentrated layer | | | Generated quantity of misfit dislocations |
| --- | --- | --- | --- | --- | --- | --- | --- |
| | | | | Thickness (nm) | Ge maximum concentration (×10²⁰ atoms/cm³) | Ge concentration ratio | |
| Example 1 | 0.0015 | 5.1 | 1.7 | 107 | 24.8 | 14.6 | Nothing generated |
| Example 2 | 0.0015 | 5.1 | 1.7 | 183 | 23.1 | 13.6 | Nothing generated |
| Comparative Example 1 | 0.0015 | 5.1 | 1.7 | 66 | 32.3 | 19.0 | Partially generated in wafer |
| Comparative Example 2 | 0.0015 | 5.1 | 1.7 | — | — | — | Entirely generated in wafer |

As cleared from Table 1, it was grasped that the misfit dislocations are greatly reduced when the thickness of the concentrated layer of germanium is 100 nm or more and the maximum concentration of germanium is about 10-fold of the doping amount (the concentration of germanium at the central portion of the wafer) of germanium.

What is claimed is:

1. A process for producing an epitaxial silicon wafer comprising the steps of
preparing a silicon wafer by slicing a silicon ingot in which boron and germanium were doped,
enhancing a concentration of said germanium in the vicinity of an interface with a thermal oxidation film of the wafer by thermally processing the wafer by oxidation to form the thermal oxidation film on a surface layer portion of the wafer,
removing the thermal oxidation film from the surface layer portion of the wafer, and
growing an epitaxial layer consisting of a silicon single crystal in which a lower concentration of boron than the concentration of boron in the wafer was doped, on a shallow surface layer portion of the wafer by an epitaxial growth method.

2. A process for producing an epitaxial silicon wafer according to claim 1, wherein the concentration of boron in the silicon wafer is $3.6 \times 10^{19}$ to $11.7 \times 10^{19}$ atoms/cm³.

3. A silicon wafer produced by the process according to claim 2.

4. A process for producing an epitaxial silicon wafer according to claim 1, wherein the concentration of germanium in the silicon wafer is 1 to 4-fold of the concentration of boron in the wafer.

5. A silicon wafer produced by the process according to claim 4.

6. A process for producing an epitaxial silicon wafer having a maximum concentration of germanium according to claim 1, wherein the vicinity of the interface with the thermal oxidation film of the silicon wafer has a thickness range of 100 nm or more from the interface toward the central portion of the wafer and the maximum concentration of the germanium in the vicinity of the interface is 10-fold or more of the concentration of germanium at the central portion of the wafer.

7. A silicon wafer produced by the process according to claim 6.

* * * * *